United States Patent [19]

Thomas et al.

[11] Patent Number: 5,679,405
[45] Date of Patent: Oct. 21, 1997

[54] METHOD FOR PREVENTING SUBSTRATE BACKSIDE DEPOSITION DURING A CHEMICAL VAPOR DEPOSITION OPERATION

[75] Inventors: Michael E. Thomas, Milpitas; Everhardus P. van de Van, Cupertino; Eliot K. Broadbent, San Jose, all of Calif.

[73] Assignees: National Semiconductor Corp., Santa Clara; Novellus Systems, Inc., San Jose, both of Calif.

[21] Appl. No.: 506,246

[22] Filed: Jul. 24, 1995

Related U.S. Application Data

[63] Continuation of Ser. No. 248,989, May 25, 1994, abandoned, which is a continuation of Ser. No. 842,819, Feb. 27, 1992, abandoned, which is a continuation of Ser. No. 554,222, Jul. 16, 1990, Pat. No. 5,133,284.

[51] Int. Cl.$^6$ .................. C23C 16/04; C23C 16/52
[52] U.S. Cl. .................. 427/248.1; 427/248.1; 427/255.1; 427/255.2
[58] Field of Search ............... 427/248.1, 255.1, 427/255.2; 118/715, 720

[56] References Cited

U.S. PATENT DOCUMENTS

| | | | |
|---|---|---|---|
| 4,595,608 | 6/1986 | King et al. | 427/237 |
| 4,963,393 | 10/1990 | Goela et al. | 427/249 |
| 4,990,374 | 2/1991 | Keeley et al. | 427/255.1 |
| 5,033,407 | 7/1991 | Mizuno et al. | 118/725 |
| 5,094,885 | 3/1992 | Selbrede | 427/248.1 |
| 5,133,284 | 7/1992 | Thomas et al. | 427/248.1 |
| 5,213,650 | 5/1993 | Wang et al. | 118/728 |
| 5,230,741 | 7/1993 | van de Ven et al. | 29/25.01 |
| 5,238,499 | 8/1993 | van de Ven et al. | 29/25.01 |
| 5,292,554 | 3/1994 | Sinha et al. | 427/248.1 |
| 5,326,725 | 7/1994 | Sherstinsky et al. | 118/728 |
| 5,328,722 | 7/1994 | Ghanayem et al. | 118/728 |
| 5,374,594 | 12/1994 | van de Ven et al. | 29/25.02 |

FOREIGN PATENT DOCUMENTS

| | | |
|---|---|---|
| 0 260 150 | 3/1988 | European Pat. Off. . |
| 3633386 | 4/1988 | Germany . |
| 62-33319 | 1/1983 | Japan . |
| 61-39520 | 7/1984 | Japan . |
| 2-308520 | 5/1989 | Japan . |

*Primary Examiner*—Shrive Beck
*Assistant Examiner*—Fred J. Parker
*Attorney, Agent, or Firm*—Skjerven, Morrill, MacPherson, Franklin & Friel

[57] ABSTRACT

A suitable inert thermal gas such as argon is introduced onto the backside of wafers being processed in a CVD reactor during the deposition of tungsten or other metals and silicides, to avoid deposition of material on the backside of the wafers being processed. Each process station includes a gas dispersion head disposed over a platen. The platen has a circular depression for receiving a wafer, and an annular groove provided in the floor of the depression, near the wall thereof. Heated and pressurized backside gas is introduced into the groove so that the wafer is maintained in a position above the floor of the depression but still within it. In this manner, backside gas vents from beneath the edge of the wafer on the platen and prevents the process gases from contacting the wafer backside. The backside gas is also used for levitating the wafer in a transfer region above the platen, so that the wafer can be transported to or from the platen with a suitable wafer transfer mechanism. One suitable transfer mechanism is a multi-armed spindle, the arms being respective pairs of tines. Another suitable transfer mechanism is a removable structure in which the platens are provided with respective heaters, and the platen-heater assemblies are supported by respective tubes from a central support block. Gas and electrical power are furnished to the platen-heater assemblies from the central support block.

15 Claims, 5 Drawing Sheets

METHOD FOR PREVENTING SUBSTRATE BACKSIDE DEPOSITION DURING A CHEMICAL VAPOR DEPOSITION OPERATION

This application is a continuation of application Ser. No. 08/248,989 filed May 25, 1994, abandoned which is a continuation of application Ser. No. 07/842,819, filed Feb. 27, 1992, abandoned which is a continuation of application Ser. No. 07/554,222, filed Jul. 16, 1990, now U.S. Pat. No. 5,133,284, issued Jul. 28, 1992.

BACKGROUND OF THE INVENTION

1. Field of the Invention

This invention relates to semiconductor processing, and more particularly to the protection of the backside of wafers during semiconductor processing operations.

2. Description of Related Art

Chemical vapor deposition ("CVD") is a gas reaction process commonly used in the semiconductor industry to form thin layers of material known as films over an integrated circuit substrate. The CVD process is based on the thermal, plasma, or thermal and plasma decomposition and reaction of selected gases. The most widely used CVD films are silicon dioxide, silicon nitride, and polysilicon, although a wide variety of CVD films suitable for insulators and dielectrics, semiconductors, conductors, superconductors, and magnetics are well known.

Particulate contamination of CVD films must be avoided. A particularly troublesome source of particulates in the chemical vapor deposition of metals and other conductors such as tungsten, tungsten silicide, and titanium nitride is the film that forms on the backside of the wafer under certain conditions. For example; if the wafer backside is unprotected or inadequately protected during deposition, a partial coating of the CVD material forms on the wafer backside. This partial coating tends to peel and flake easily for some types of materials, introducing particulates into the chamber during deposition and subsequent handling steps.

Many approaches have been developed for addressing the problem of material deposition on the wafer backside. In one approach, the material is permitted to form on the backside, but then is removed immediately following the deposition step using an in-situ plasma etch. This approach entails additional process steps and requires additional equipment capabilities and also affects the flatness of the wafer. In another approach, the wafer is clamped onto a substrate holder in an attempt to seal and isolate the backside region from the CVD gas. An adequate seal tends be difficult to achieve in practice, and the mechanical motion between the clamp and the wafer itself causes particulates. Yet another approach is disclosed in U.S. Pat. No. 4,817,558, issued Apr. 4, 1989 to Itoh. A substrate support member having the form of a cylinder is provided with a flat bearing surface on which the wafer rests. Three pins protrude from the peripheral edge portion of the bearing surface. The sidewalls of the shield are insulated from the reactive gases by a cover, which is further provided with a lifted and bent region that surrounds the substrate at the level of the substrate. The lifted and bent region is said to trap the reactive gas on the lateral face of the wafer, thereby preventing a film from being deposited on the wafer backside.

SUMMARY OF THE INVENTION

Undesirable deposition of materials on a substrate backside is diminished in the substrate support apparatus of the present invention, which in one embodiment includes a platen having a substrate retainer that is ineffective for sealing an edge of a substrate to be processed against a surface portion of the platen. A gas disperser is provided in the platen surface portion, and a gas line integral with the gas disperser extends through the platen.

In another embodiment, the substrate support apparatus is also suitable for transporting a substrate in a process chamber. A wafer transport mechanism having an arm is included with the substrate support apparatus within the process chamber. The arm of the wafer transport mechanism is selectively movable into a transfer region above the platen surface portion and into a space remote from the platen. The gas disperser and gas source are capable of levitating the substrate in the transfer region.

Undesirable deposition of materials on a substrate backside is diminished in a method that in one embodiment includes the steps of receiving the substrate on a platen and introducing a process gas into the process chamber. In addition, a volume of backside gas is uniformly dispersed from the platen into a region between the backside periphery of the substrate and the platen, and the substrate is retained on the platen without fully sealing the edge of the substrate to be processed against the platen. The volume of backside gas is selected to establish an outward radial flow thereof throughout the peripheral region and into the process chamber, such that the outward radial flow is sufficient to impede process gases from contact with the substrate backside.

In another embodiment, the method for diminishing backside deposition includes transporting the substrate into a transfer region over the platen, and dispensing a volume of backside gas from the platen sufficient to levitate the substrate in the transfer region.

In another embodiment, the method for diminishing backside deposition includes disposing the substrate within a depression in the platen, the volume of backside gas being selected to maintain the substrate above the floor of the depression and within the depression.

BRIEF DESCRIPTION OF THE DRAWINGS

In the drawings, in which like reference numerals refer to like parts.

DESCRIPTION OF THE PREFERRED EMBODIMENT

Figure 1:
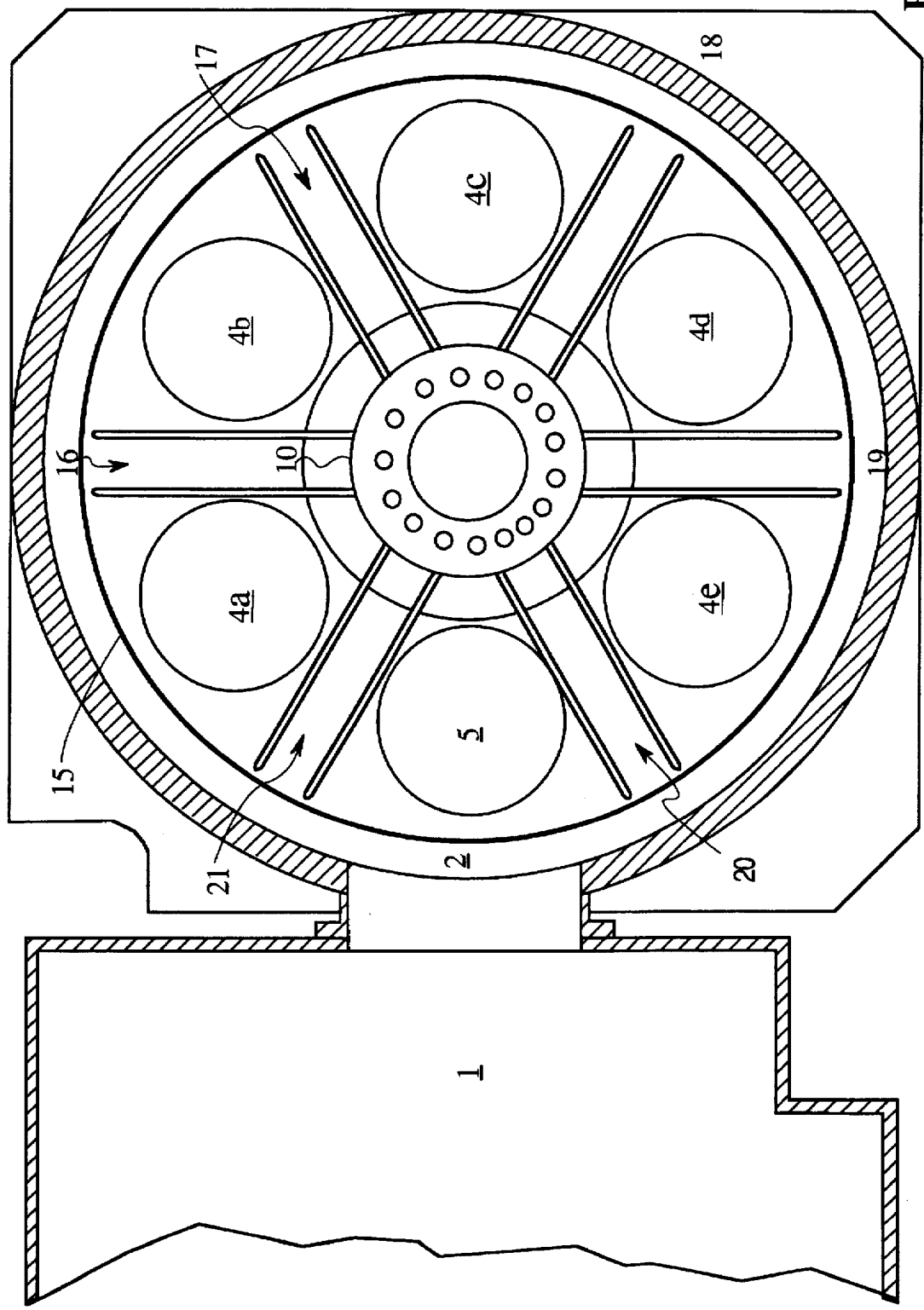
FIG. 1 is a cut away plan view of a process chamber for a chemical vapor deposition system, as viewed from above.
Figure 2:
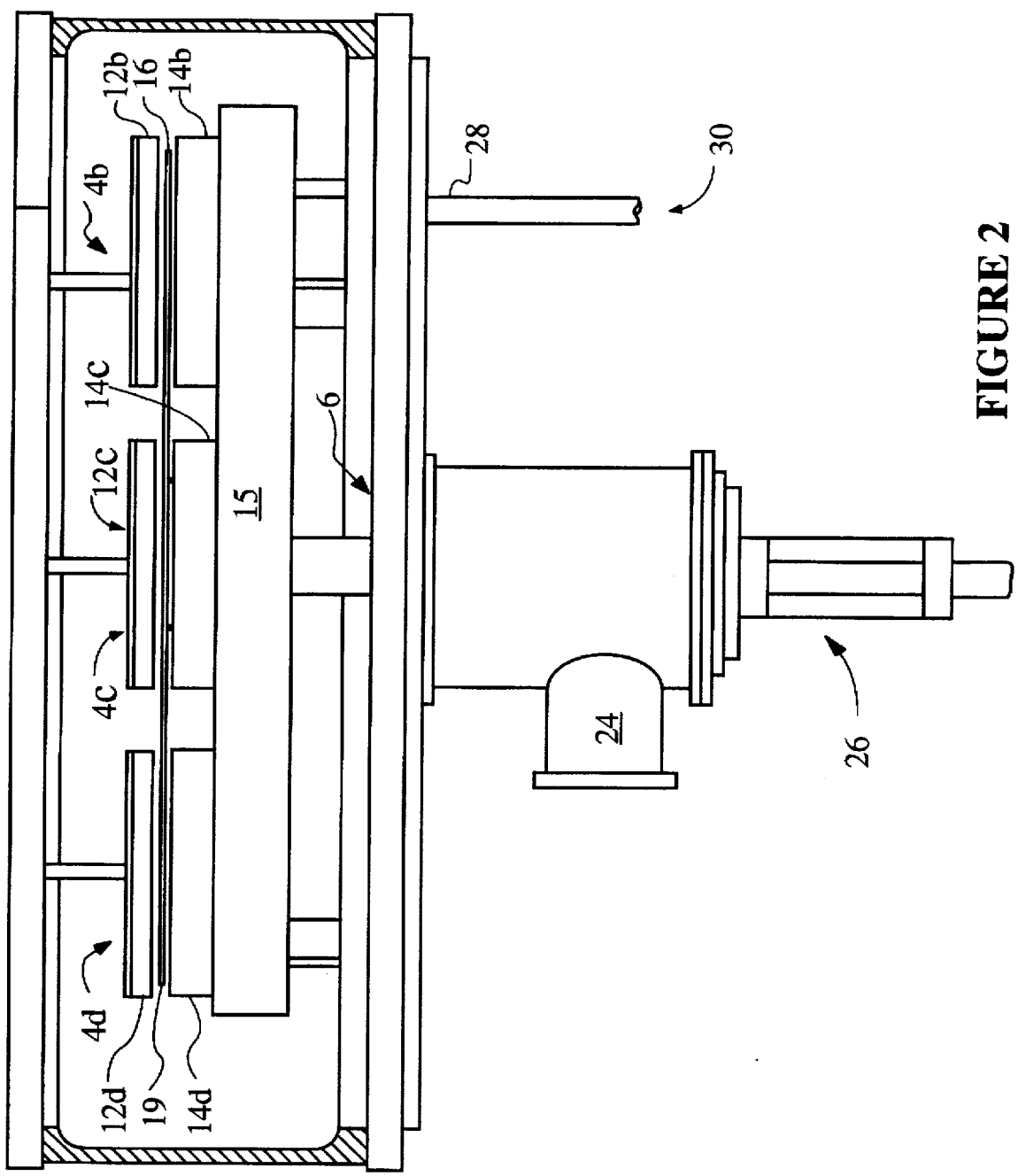
FIG. 2 is a cut away plan view of the process chamber of FIG. 1, as viewed from a side.

An illustrative reaction chamber of a high pressure chemical vapor deposition ("CVD") apparatus is shown from a top view in FIG. 1, and from a side view in FIG. 2. The process chamber 2 communicates with a load lock chamber 1, from which wafers to be processed are introduced into the process chamber 2, and into which processed wafers are received from the process chamber 2. Within process chamber 2 are five wafer process stations 4a–4e and a wafer load/unload station 5. Chamber gases are exhausted through a central exhaust 6 in the bottom of the process chamber 2, which leads into a vacuum exhaust port 24. The system for moving wafers from station to station in the chamber 2 includes wafer transport mechanism 10 and a spindle rotation mechanism 26, the design of which are wellknown in the art. Wafer transport mechanism 10 is in the form of a multi-armed spindle having six arms 16, 17, 18, 19, 20 and 21. Each of the arms 16–21 is made of a pair of tines. Each tine may be perforated with numerous holes (not shown) or otherwise modified to minimize air flow interference.

Wafer process stations 4b, 4c and 4d are visible in more detail in the side view of FIG. 2. Process station 4c, for example, includes a dispersion head 12c for introducing a process gas or gas mixture over a wafer to be processed, a platen 14c for supporting the wafer to be processed, and a tube 13c (hidden) for delivering a gas (a "backside" gas) through the platen 14c to the backside of a wafer being processed. Process station 4c is mounted on the heater 15, and tube 13c passes through the heater 15. Similarly, process station 4b includes gas dispersion head 12b, platen 14b, and tube 13b (hidden), and is mounted on the heater 15. Similarly, process station 4d includes gas dispersion head 12d, platen 14d, and tube 14d (hidden), and is mounted on the heater 15.

A backside gas delivery system 30 includes a gas delivery tube 28 and various tubes 13a–13f (not shown) of the stations 4a–4e and 5 respectively, which are connected inside the heater 15 to the gas delivery tube 28. The tubes 13a–13f are heated within heater 15 by being mounted in proximity to heating elements (not shown) or in any other suitable manner, so that gas passing through them becomes heated. If desired, heated baffles, fine wire meshes, or metal sponges (not shown) are placed in the gas distribution system 30 to improve the transfer efficiency of heat to the gas.

Figure 3:
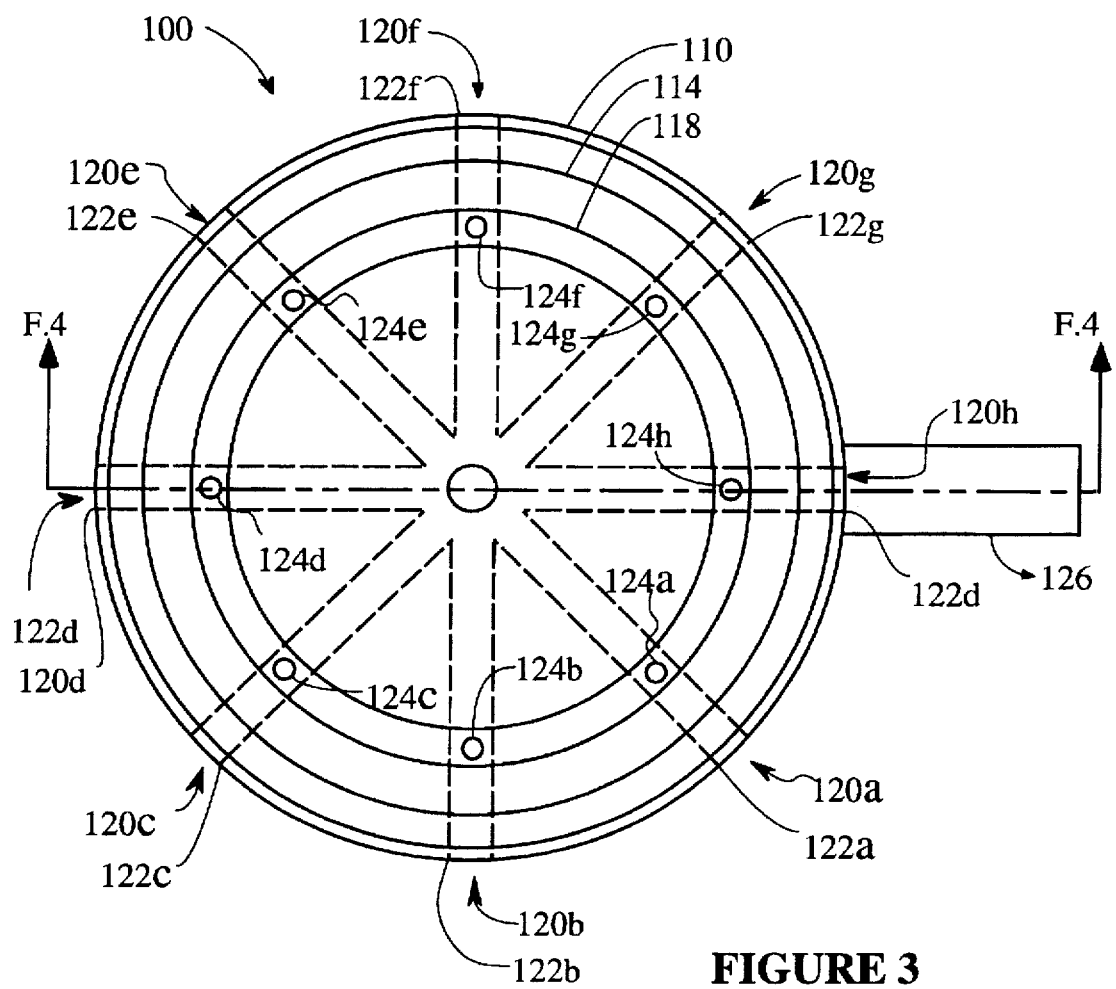
FIG. 3 is a top plan view of a platen illustrative of the platens shown in FIG. 1.
Figure 4:
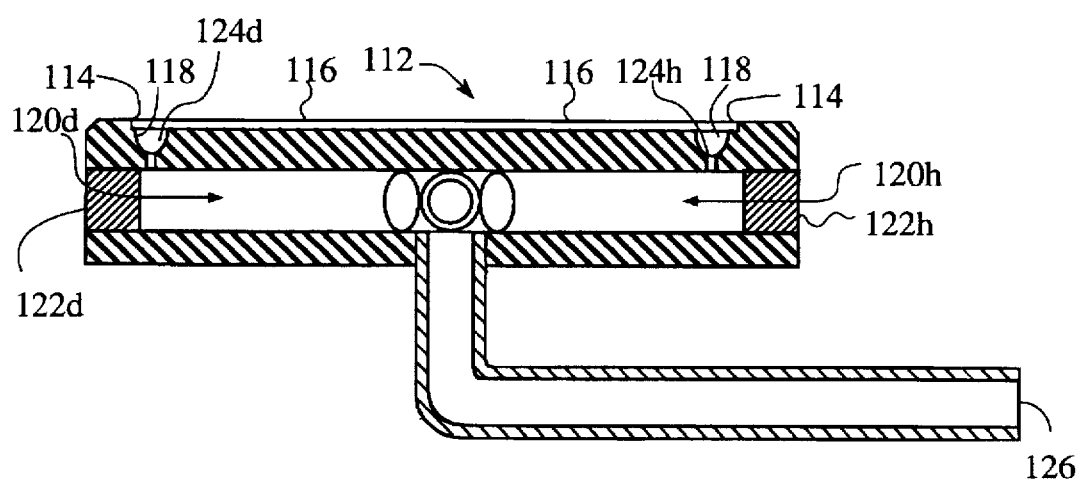
FIG. 4 is a cross-sectional view of the platen of FIG. 3 mounted on a pedestal base, taken along line F.4—F.4.

A platen 100 illustrative of platens 14a–14e of FIGS. 1 and 2 is shown in detail in FIGS. 3 and 4. A disk 110 made of a suitable material such as aluminum is provided with a recessed region 112, which functions both to receive and retain a semiconductor wafer to be processed. Other suitable materials include certain metal or ceramic alloys, including stainless steel and nickel, which can be used in the reactive process environment without being degraded. The recessed region 112 has a sidewall 114 and a floor 116. The sidewall 114 is angled 5 degrees relative to the normal to the floor 116, the diameter of which is 4.06 inches for accommodating a four inch wafer. The floor 116 is provided with an annular groove 118, which has an outside diameter of 3.69 inches, a width of 0.19 inches, and a depth of 0.16 inches.

The operation of recessed region 112 as a substrate retainer is discussed more fully below, but it will be appreciated that other types of substrate retainers may be used as well. For example, the upper surface of disk 110 may be made flat, and the wafer to be processed may be confined by pins rising from the upper surface of disk 110. Assume, for example, a prevailing gas flow during wafer processing from the bottom to the top of the illustrative platen 100 of FIG. 3. In a two pin embodiment (not shown), two pins are provided in locations corresponding to, for example, two points just outside of the sidewall 114 of FIG. 3, at about the angular position of radial bores 124e and 124g respectively. These pins resist the force imparted to the wafer being processed by the prevailing gas flow. Three or more pins may be provided if desired. If a clamping effect is desired, the pins may be slanted inward toward the center of disk 110, or may be hooked at their tops toward the center of the disk 110. Other suitable retainers include a ring which mounts over the periphery of its upper surface, or clamps which engage the outside edge of the wafer at three or more positions. The wafer to be processed may even be confined by jets of gas directed at the wafer backside, provided that the jets impart equal and evenly distributed forces to the wafer backside.

The platen of FIGS. 3 and 4 is provided with a gas injector system that includes eight radial bores 120a–120h and respective orifices 124a–124h. The orifices 124a–124h are provided between the bores 120a–120h and groove 118. As shown, groove 118 is a continuous annular channel, but other forms are suitable as well. For example, the channel may be discontinuous (segmented), or configured to match the edge configuration of the wafers being processed, or configured in a particularly easily manufacturable shape. The cross-sectional channel shape is semicircular, but other shapes such as rectangular are suitable as well. The channel may be placed nearer the wafer edge or nearer the center, although a more even pressure distribution is believed to be established by placing the channel nearer the wafer edge. Plural channels may be provided if desired.

The bores 120a–120h are equally spaced at 45 degree from one another and merge in the center of the disk 110. The radially remote ends of the bores 120–120h are closed by press fitted plugs 122a–122g. A tube 126 is press-fit into a hole passing from the bottom of the disk 110 into the chamber formed by the merging of the bores 120a–120h. Tube 126 has an outer diameter of 0.38 inches. The process stations 4a–4e and the load/unload station 5 are furnished with respective gas delivery tubes 13a–13f (hidden), which are similar to tube 126. Gas delivery tubes 13a–13f are routed through the heater 15 in any suitable manner.

The diameter of the bores 120a–120h and the inner diameter of the tube 126 is 0.25 inches. The diameter of the orifices 124a–124h is 0.063 inches. Generally, the selection of the diameters of the bores 120 and the orifices 124 and the number of orifices 124 are a matter of design choice, consistent with the volume of gas intended to be supplied to the wafer backside.

The design of wafer load/unload station 5 is essentially identical to the illustrative platen 100. The recess 112 need not be provided, however.

A variety of materials including tungsten, tungsten silicide, and titanium nitride are deposited on a wafer using the apparatus of FIGS. 1 and 2 as follows. The wafer to processed is introduced into the process chamber 2 from the load lock chamber 1 into an empty load/unload station 5. Suitable mechanisms for transporting the wafer from a carrier to the station 5 are well known, and include, for example, multi-segmented arm mechanism terminating in a pair of tines on which the wafer to be transported rests.

The tubes 13a–13f of the gas distribution system 30 are coupled to respective networks of bores within each of the stations 4a–4e and 5 which correspond to bores 120a–120h of the illustrative platen 100. A suitable inert thermal gas such as argon, helium, freon, $C_2F_6$, or $CF_4$, or any suitable combination thereof, is introduced into the gas distribution system 30. A thermal gas is any gas having thermal conductivity and heat capacity sufficient to achieve good temperature uniformity across the wafer. An inert gas is any gas that does not react adversely with the materials present in the process chamber 2 and in the gas distribution system, and that does not participate in the chemical reactions involved. The flow of the introduced or "backside" gas is adjusted to levitate the wafers to be processed in the stations 4a–4e and 5. For example, a levitation flow of one standard liter per minute of argon is suitable.

Once the wafers at the stations 4a–4e and 5 are levitated, wafer transport mechanism 10 rotates 30 degrees in a desired direction so that arms 16–21, which previously rested in positions between the stations 4a–4e and 5, assume new positions under each of the six wafers in the process chamber 2. As the tines of the wafer transport mechanism 10 are designed to minimize air flow interference, the floating balance of the six wafers is maintained. The backside gas pressure is reduced to a sufficiently low value or to zero for depositing the wafers on the respective tines of arms 16–21 of the wafer transport mechanism 10. Wafer transport mechanism 10 now rotates 60 degrees in a desired direction so that the wafers are transported to respective successive ones of the stations 4a–4e and 5. Once again, the flow of the backside gas is increased to the levitation value to lift the wafers up from the arms 16–21 of the wafer transport mechanism 10. Wafer transport mechanism 10 now rotates 30 degrees in a desired direction, so that the arms 16–21 once again rest in positions between the stations 4a–4e and 5. Backside gas pressure is reduced to a suitably low value or zero, so that the wafer at the load/lock station 5, which is fully processed, is deposited on the tines of the load/unload mechanism and removed into the load lock chamber 1. The flow of gas to load/unload station 5 is completely shut off using a suitable valve.

The wafers to be processed now rest upon or are slightly levitated over respective platens 14a–14e, under respective gas dispersion heads 12a–12e. The flow of the backside gas is now coordinated with the flow of a process gas at the gas dispersion heads 12a–12e to levitate the wafers to be processed within the respective recessed areas of process stations 4a–4e corresponding to recess 112 of FIGS. 3 and 4. The flow of the backside gas is adjusted to compensate for the pressure of the process gas dispersed directly upon the wafer by the dispersion heads 12a–12e, which is somewhat in excess of the process pressure in chamber 2. The process pressure in chamber 2 typically is about 10 Torr, depending on the process in use. As the backside gas is introduced through groove 118 into the space between the wafer backside and the floor 116, a uniform pressure is maintained under the wafer and a positive backside flow is maintained from under the edge of the wafer into the process chamber 2. The wafers being processed are slightly levitated, due to the small pressure differential between the wafer backside and face.

The backside gas is furnished under a pressure from 1 to 20 Torr and a flow rate of from about 0.3 to about 1.0 liter, depending on the process pressure in chamber 2 and the desired rate of venting from underneath the wafer's edge. It is estimated that the difference between the ambient pressure in the chamber 2 and the pressure under the wafer is from about 1 to about 5 Torr.

The backside gas vents from beneath the wafer's edge into the process chamber 2. In the process chamber 2, the backside gas mixes with the process gas and is vented through the exhaust 6, thereby creating a radial gas flow from the circumference of the process chamber 2 toward its center. While this radial flow tends to entrain the wafers being processed at the wafer process stations 4a–4e, the recessed regions of the of the platens 14a–14e corresponding to the recessed region 112 of the illustrative platen 100 (FIGS. 3 and 4) function as substrate retainers. The presence of the backside gas between the wafer backside and the floor 116 and the outward flow from under the wafer edge and into the process chamber 2 sufficiently impedes process gas from reaching any portion of the wafer backside, thereby preventing backside deposition.

The backside gas is furnished to the heater 15 through delivery tube 28. The heater 15 is heated by any suitable technique. The backside gas is heated both within the heater 15 and as it flows through the various bores of the stations 4a–4e corresponding to bores 120a–120h of the illustrative platen 100, and transfers heat to the wafers as it contacts them. Typically, the temperature of the backside gas is from between 350 and 450 degrees C.

A variety of process gases may be selected. For example, in depositing a tungsten film at a deposition rate of 2000 A/min, for example, the product reactant $WF_6$ is used under the reactant conditions of $H_2$ at a deposition temperature of 400 degrees C and an operating pressure of 10 Torr. In the apparatus of FIGS. 1 and 2, the flow of process gas is on the order of 2.5 liters per minute. The actual pressure on the wafer being processed is somewhat greater than 10 Torr because the flow of gas from the gas dispersion head impinges directly on the Surface of the wafer. Under these process conditions, a suitable backside gas is Argon. The volume of backside gas flowing from beneath the wafer under such conditions ranges from 500 cubic centimeters to 2 liters for each of the process stations 4a–4e.

Figure 5:
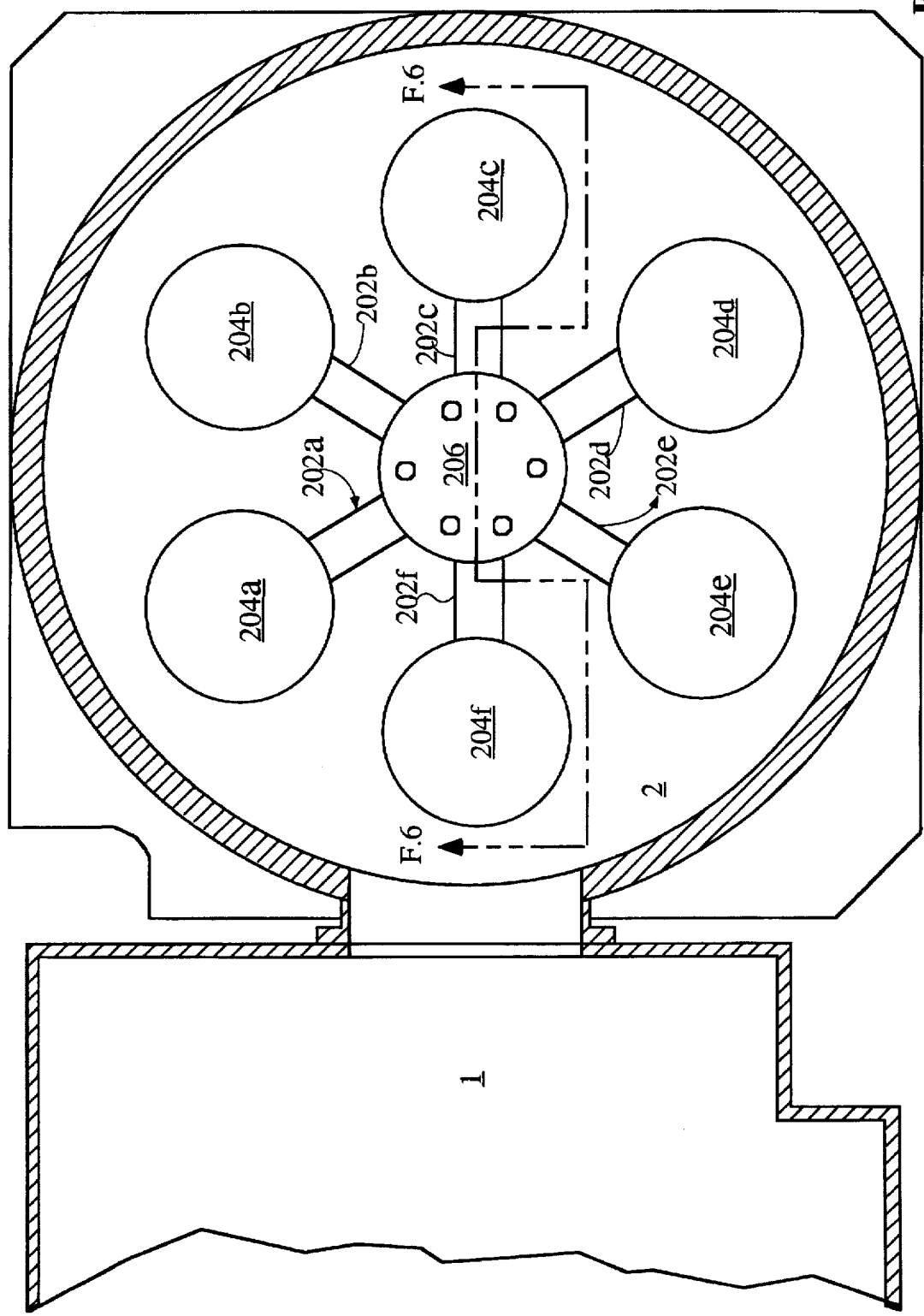
FIG. 5 is a top plan view of a wafer transport and backside protection structure.
Figure 6:
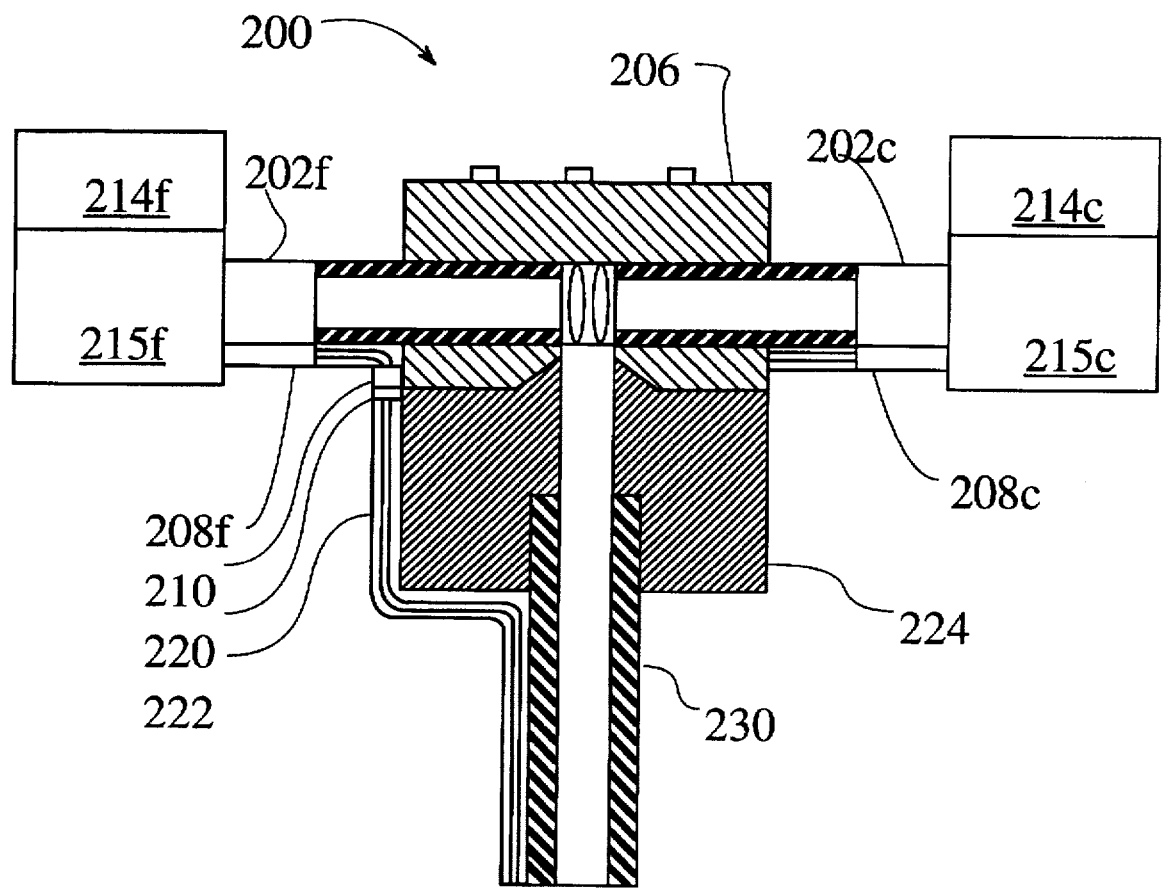
FIG. 6 is a partial cross-sectional view of the structure of FIG. 5.

A structure that integrates the functions of wafer transport and wafer backside protection in a unit removable for maintenance and repair is shown in FIGS. 5 and 6. The removable integrated structure 200 includes platen-heater assemblies 204a–204f, which include individual platens 214a–214f similar to the illustrative platen 100 mounted on individual heaters 215a–215f. Gas delivery tubes 213a–213f (hidden), which are similar to tube 126, are routed through respective heaters 215a–215f and connect to tubes 202a–202f. Tubes 202a–202f function as gas delivery tubes and support for the platen-heater assemblies 204a–204f. Tubes 202a–202f are fitted into support block 206, which is suitably bored to receive them, and welded or otherwise suitably secured. Power is supplied to the heaters 215a–215f through paired conductors, which run through electrical conduits 208a–208f (hidden in FIG. 5) and are interconnected in any suitable manner in female connector 210.

The structure 200 is removably connected to the rotation mechanism 26 (FIG. 2) as follows. Shaft 230 is driven by the rotation mechanism 26. Shaft 230 is fitted into mounting block 224, which is suitably bored to receive it, and welded or otherwise suitably secured to the mounting block 224. Shaft 230 is hollow, and the bore which receives shaft 230 is made through the mounting block 224 to a surface that is designed to mate in a gas-tight manner with the support block 206. Support block 206 is secured to the mounting block 224 by bolts or in any other suitable manner. Accordingly, backside gas introduced into the shaft 230 is conveyed to bores in the support block 206, which distribute the backside gas to the tubes 202a–202f. Female connector 210 is detachably connected to male connector 220, which receives power from a pair of conductors which run through a single electrical conduit 222.

While our invention has been described with respect to the embodiments and variations set forth above, these embodiments and variations are illustrative and our invention is not to be considered limited in scope to these embodiments and variations. For example, the various shapes and dimensions and the various flow rates and pressures set forth herein are illustrative, and other shapes, dimensions, flow rates, and pressures may also be effective for the intended purpose. Moreover, the process and backside gases discussed herein are illustrative, and other process and backside gases and gas mixtures may also be effective for the intended purpose. Accordingly, other embodiments and variations not described herein are to be considered within the scope of our invention as defined by the following claims.

What is claimed is:

1. A method of preventing backside deposition on a semiconductor substrate during a chemical vapor deposition operation in a process chamber, the semiconductor substrate having frontside and backside surfaces meeting at an edge, the method comprising:

receiving the substrate over a platen;

introducing a reactive gas into the process chamber;

introducing a volume of backside gas into a backside region between the backside surface of the substrate and the platen so as to levitate the substrate above the platen, the backside gas lacking the reactive gas; and retaining the substrate above the platen without sealing the edge of the substrate against the platen;

wherein the volume of backside gas establishes an outward radial flow of the backside gas from the backside region and past the edge of the substrate to exclude the reactive gas from contact with the backside surface of the substrate.

2. A method as in claim 1 wherein the platen includes a recessed region having a floor, and wherein the retaining step comprises the step of disposing the substrate within the recessed region in the platen, and wherein the volume of backside gas is selected to maintain the substrate above the floor of the recessed region and within the recessed region.

3. A method as in claim 1 wherein:

the backside gas introducing step comprises maintaining a pressure of the backside gas against the backside surface of the substrate to levitate the substrate such that the substrate is lifted above the platen; and the retaining step comprises engaging the substrate levitated in the maintaining pressure step with at least three pins projecting from the platen beyond the edge of the substrate to provide a clamping effect.

4. A method as in claim 3 wherein the pins are slanted inwardly toward a central point of the substrate.

5. A method as in claim 3 wherein the pins are hooked inwardly toward a central point of the substrate.

6. A method as in claim 1 wherein the process chamber is pressurized, the method further comprising establishing a uniform pressure of the backside gas in the backside region, the pressure of the backside gas being greater than the pressurization of the process chamber.

7. A method as in claim 1 wherein:

the reactive gas comprises $WF_6$ and $H_2$; and the backside gas consists of argon.

8. A method as in claim 1, further comprising:

introducing another reactive gas into the process chamber;

wherein the backside gas comprises an inert gas.

9. A method as in claim 8 wherein the inert gas comprises argon.

10. A method for protecting portions of a semiconductor wafer from deposition during chemical vapor deposition operations in a process chamber containing a platen, the semiconductor wafer having frontside and backside surfaces meeting at an edge, the method comprising:

providing a process gas comprising one or more reactive gases in the process chamber at a pressure to deposit a product on the frontside surface of the wafer;

furnishing a backside exclusion gas from an opening in the platen at a flow selected to levitate the wafer above the platen, the backside exclusion gas comprising an inert gas and lacking at least one of the one or more reactive gases of the process gas, wherein the lack of at least one of the one or more reactive gases prevents the formation of the product on the backside surface of the wafer;

uniformly flowing the backside exclusion gas past the edge of the wafer into the process chamber to exclude the process gas from the backside surface of the wafer, the backside exclusion gas mixing with the process gas in the process chamber;

retaining the wafer above the platen during the flowing step without obstructing the flow of the backside exclusion gas past the edge of the wafer; and venting the mixture of process gas and backside exclusion gas obtained in the flowing step from the process chamber.

11. A method as in claim 10 wherein the process gas comprises at least two reactant gases.

12. A method as in claim 11 wherein the process gas comprises $WF_6$ and $H_2$.

13. A method as in claim 10 wherein the inert gas is argon.

14. A method as in claim 11 wherein the process gas comprises a product reactant and a reactant.

15. A method for protecting portions of a semiconductor wafer from deposition during chemical vapor deposition operations in a process chamber containing a platen, the semiconductor wafer having frontside and backside surfaces meeting at an edge, the method comprising:

providing a process gas comprising a mixture of a product reactant and a reactant in the process chamber at a pressure to deposit a product on the frontside surface of the wafer;

furnishing a backside exclusion gas from an opening in the platen to levitate the wafer above the platen, the backside exclusion gas lacking the product reactant and the reactant;

uniformly flowing the backside exclusion gas from the furnishing step past the edge of the wafer into the process chamber to exclude the process gas from the backside surface of the wafer, a mixture comprising the backside exclusion gas, the product reactant, and the reactant being formed in the process chamber beyond the edge of the wafer;

retaining the wafer about the platen during the flowing step without obstructing the flow of the backside exclusion gas past the edge of the wafer; and venting the mixture of the backside exclusion gas, the product reactant, and the reactant formed in the flowing step from the process chamber.

* * * * *